United States Patent [19]

Lannes

[11] Patent Number: 5,321,325
[45] Date of Patent: Jun. 14, 1994

[54] SINGLE INPUT PUSH-PULL CIRCUIT

[76] Inventor: Kenneth J. Lannes, 610 Meadowcrest, Highland Village, Tex. 75067

[21] Appl. No.: 85,731

[22] Filed: Jul. 6, 1993

[51] Int. Cl.⁵ ............................................. H03F 3/68
[52] U.S. Cl. ........................... 307/491; 333/149; 307/555; 307/562; 307/282; 328/21
[58] Field of Search .............. 307/494, 491, 540, 542, 307/546, 555, 562, 268, 282; 328/21, 22, 158, 159; 330/149

[56] References Cited

U.S. PATENT DOCUMENTS

| | | | |
|---|---|---|---|
| 3,564,298 | 2/1971 | Colino | 307/542 |
| 3,822,408 | 7/1974 | Veranth | 307/562 |
| 3,851,259 | 11/1974 | Dorawski | 307/494 |
| 4,015,215 | 3/1977 | Seki | 330/149 |
| 4,021,684 | 5/1977 | Macey | 307/268 |
| 4,041,408 | 8/1977 | Trotnick, Jr. | 330/149 |
| 4,079,332 | 3/1987 | Padgett | 330/253 |
| 4,415,865 | 11/1983 | Gustafsson | 330/271 |
| 4,644,289 | 10/1985 | Kennedy et al. | 330/145 |
| 4,710,727 | 12/1987 | Rutt | 330/110 |
| 4,811,401 | 3/1989 | Brown, Sr. et al. | 381/61 |
| 4,987,381 | 1/1991 | Butler | 330/255 |
| 5,012,128 | 4/1991 | Chan | 307/491 |
| 5,032,796 | 7/1991 | Tiers et al. | 330/253 |
| 5,127,059 | 6/1992 | Elion et al. | 381/120 |

Primary Examiner—Timothy P. Callahan
Assistant Examiner—Tuan T. Lam

[57] ABSTRACT

The invention relates to a modified electronic amplifier of the push/pull configuration. The difference being that only one signal (as apposed to two signals 180 degrees out of phase) is needed to drive the amplifier, the distortion in the nonlinear region is asymmetrical, and a feedback signal is used which automatically compensates for differences between the two active elements (tubes or transistors) that comprise the push/pull amplifier.

1 Claim, 3 Drawing Sheets

SINGLE INPUT PUSH-PULL CIRCUIT

BACKGROUND OF THE INVENTION

For the past 20 years, people have been analyzing the difference between tubes and transistors, this has been particularly true in the audio world. The primary difference between the two has to do with how they operate in the nonlinear region. Tubes tend to distort in an asymmetrical manner (relative to the Q or operating point), and transistors tend to distort in a more symmetrical manner with respect to the Q point. Herein lies the big difference. If a sine wave is input into a tube amplifier, which is operating in the nonlinear region, the output will not exhibit half wave symmetry due to the asymmetrical distortion. The bottom line of this is that even ordered harmonics will be promoted. If a sine wave is input into a transistor amplifier, operating in the nonlinear region, half wave symmetry will prevail in the output signal, due to the symmetrical distortion properties of the transistor. The bottom line of this is that odd ordered harmonics will be promoted. The even ordered harmonic generation is apparently more pleasant to the human ear, thus resulting in a big resurgence in popularity for tube amplifiers.

However, tubes can act like transistors depending on the circuit they are used in. A perfect example of this is in a classic push/pull circuit. One tube in the circuit distorts the top half of the signal, and the other tube in the circuit (operating 180 degrees out of phase) distorts the lower half of the signal in the same manner. Hence, half wave symmetry is promoted and even ordered harmonics are cancelled. Basically, symmetrical push/pull circuits cancel even ordered harmonics and promote odd ordered harmonics when driven into the non-linear range.

The system of the present invention (a single input push/pull circuit), does exactly the opposite. It cancels odd ordered harmonics and promotes even ordered harmonics. Furthermore, it has become very desireable to match the tube pairs used in push/pull amplifiers, by performance criteria. The system of the present invention eliminates the need to match the tubes due to the feedback path in the circuit. However, high quality, high performance tubes are still recommended.

It should be known that this circuit can also be applied to transistors, or any other solid-state device that emulates the transfer characteristics of a vacuum tube. FETs (field effect transistors) act in this manner if biased correctly.

Many inventions of past address push/pull circuits but don't address the cancellation of even ordered harmonics, the matching of the active components, or the ability to drive the circuit with one signal which affords the designer the ability to apply filtering in the final (push/pull) stage without dual-ganged components.

U.S. Pat. No. 4,021,684 doesn't employ feedback in the same manner as the present invention, and creates symmetrical distortion. U.S. Pat. No. 4,987,381 is nothing more than a FET push/pull amplifier that keeps the preamp in the linear region while saturating the push/pull stage. U.S. Pat. No. 5,032,796 provides asymmetrical distortion but does not address this feature in a push/pull configuration. U.S. Pat. No. 4,710,727 generates distortion but doesn't address a push/pull configuration. Nor does it allow for feedback to compensate for the difference between components if a push/pull amplifier were used for item #305 in the diagram. U.S. Pat. No. 4,079,332 requires two inputs 180 degrees out of phase and doesn't incorporate feedback. U.S. Pat. No. 4,811,401 again is not a push/pull amplifier. U.S. Pat. No. 5,127,059 is a preamp, not a push/pull amplifier. U.S. Pat. No. 4,415,865 is a control for the quiescent current of an AB push/pull amplifier and doesn't address asymmetrical distortion. U.S. Pat. No. 4,644,289 is very similar to the present invention in that it can generate asymmetrical distortion, however, this distortion is generated in a preamp stage and it doesn't address feedback for the purpose of compensating for the difference in component performance.

BRIEF SUMMARY

Unlike most push/pull circuits, the single input push/pull circuit requires only 1 input, not 2 inputs 180 degrees out of phase. Thus, the phase inversion necessary in a push/pull amplifier is achieved in the push/pull stage instead of in a previous stage.

The signal present at the input of the first device (tube/transistor) generates an output which is fed to the summing circuit. Since there is no input at the other terminal of the summing circuit, an error signal is produced at the output of the summing circuit and fed to the input of the second device. This input signal generates an output in the second device, which is fed to the summing circuit, and creates a signal that emulates the output of the first device, only 180 degrees out of phase, in an effort to drive the error to zero. Hence, the second device acts as a slave to the first always emulating the output of the first. Therefore, when the first device is operating in the non-linear region and generating an output signal with nonsymmetrical distortion, the second device is following it, not fighting it so to speak; countering the nonsymmetrical action as is done in a conventional push/pull stage.

While this type of phase inversion has been used in circuits before, the use of it in the final output stage to cancel odd ordered harmonics and eliminate the need for matched sets of devices, is the purpose of the present invention.

DETAILED DESCRIPTION

Figure 1:
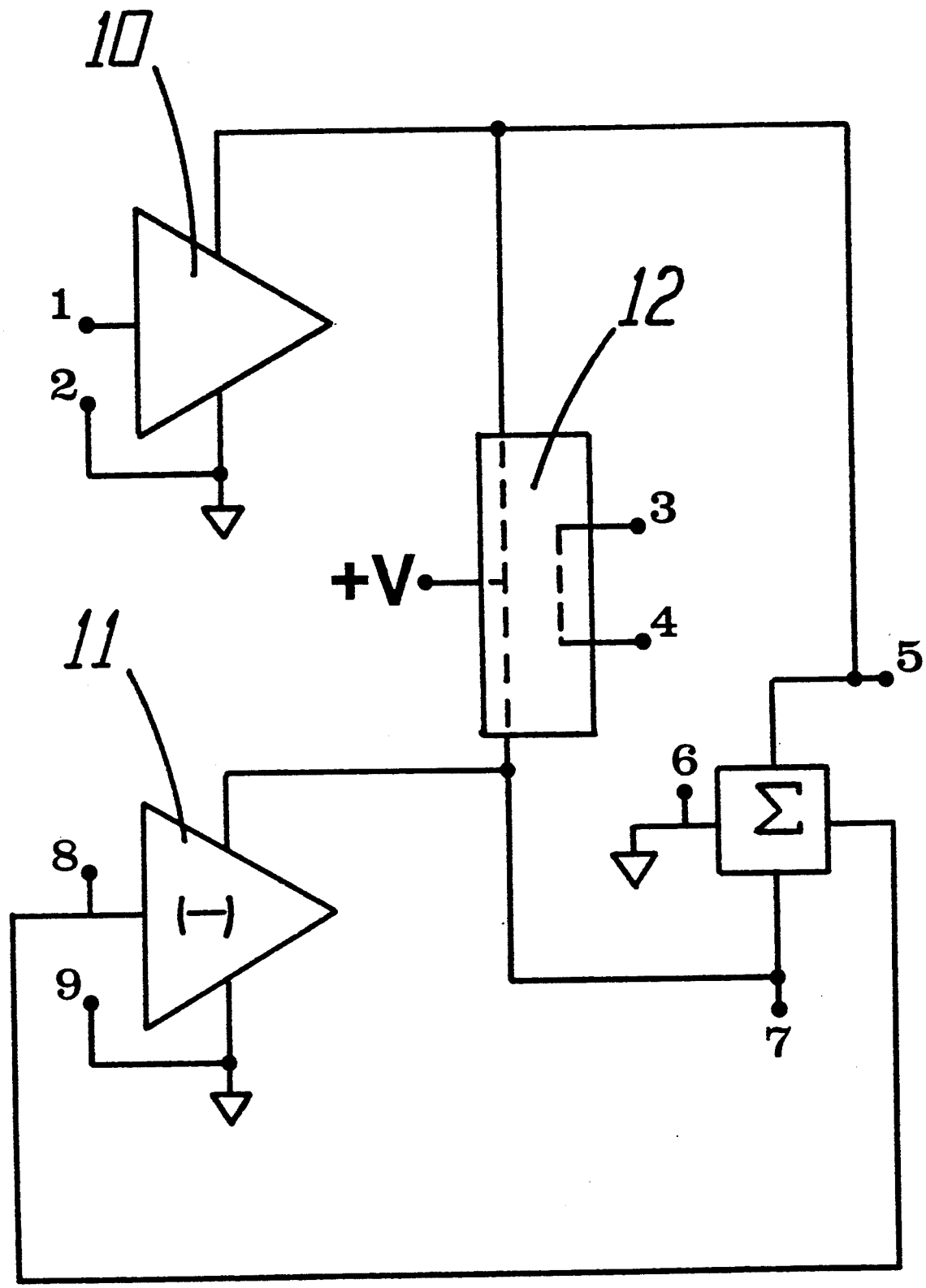
FIG. 1 is a block diagram showing the active devices and the signal flow of the circuit.
Figure 2:
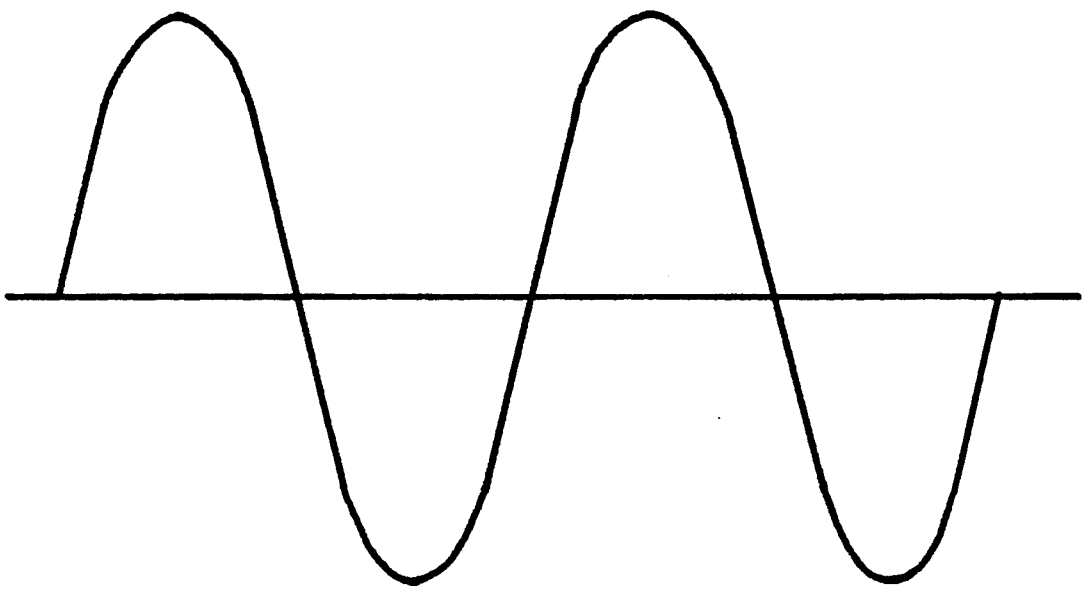
FIG. 2 is a figure of a nondistorted sine wave which would be inputted to the circuit as a test signal.
Figure 3:
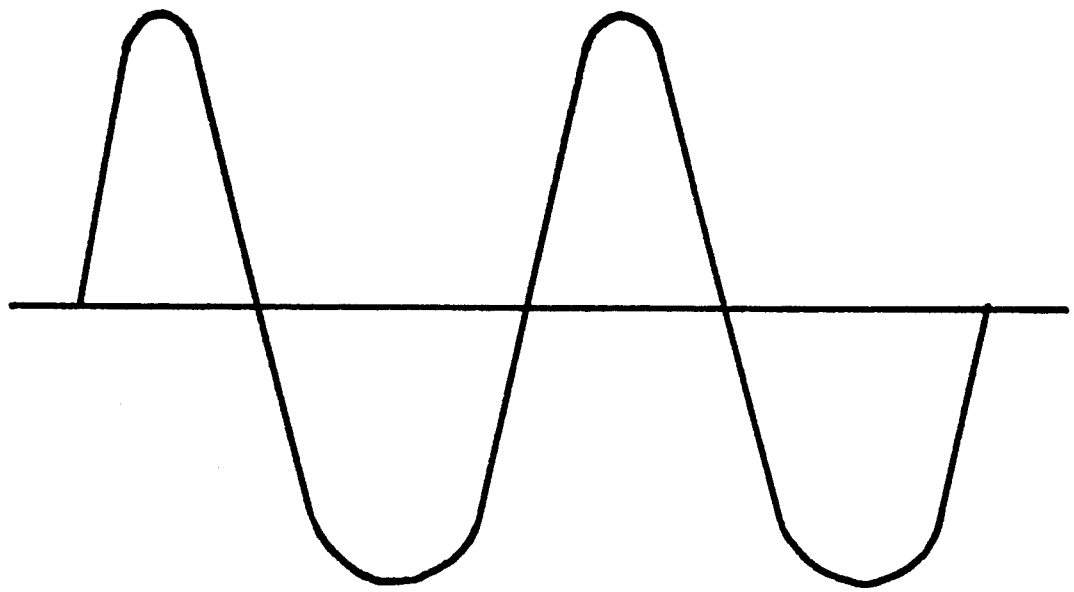
FIG. 3 is a figure of a sinewave present at the output of the present invention. It shows nonsymmetrical distortion; the lack of half wave symmetry is shown. The exact shape of the wave will vary depending on the type of device and the level of distortion. The main point is the lack of half wave symmetry.

Refering to FIG. 1, a sine wave (shown in FIG. 2) is input between terminals 1 and 2. This signal is amplified by the device the terminals feed [10]. The output of the device produces a distorted sine wave (as shown in FIG. 3) since it is operating in the non-linear region. This signal is fed to one input (terminals 5 and 6) of the summing circuit. The purpose of the summing circuit is to generate an error signal which is fed to the input of the second device [11] (represented by terminals 8 and 9), which amplifies it and inverts it. This signal is then sent to the other input of the summing circuit (terminals 7 and 6), which begins to cancel the error signal. If the second device [11] had infinite gain, the error would go to zero. Realistically, there is always a small error signal present. In summary, if the first device generates a rising voltage in its output, then the summing circuit generates a rising voltage error signal. This signal is fed to the input of the second device whose output equals the output of the first device, except its polarity is opposite, so that the difference between them (i.e. the error signal) is driven to zero in the summing circuit.

The outputs of device 10 and device 11 are coupled by a device such as a transformer [12]. The majority of the power generated in the outputs of the devices is delivered to the load through the coupling device. This is because the only other circuit in parallel with the outputs is the summing circuit, which is designed to have a very high impedance relative to the coupling device and hence, the power delivered to it is negligible for all practical purposes.

It is important to note what is meant by "the nonlinear region" of an amplification device that acts like a vacuum tube. The nonlinear region, as described by this paper, is not limited to the region of operation where cutoff and saturation occur. It also includes the region right before cutoff and saturation is reached. In this region, there is still considerable distortion, as shown by FIG. 3. In order for the circuit of the present invention to operate in this region, the circuit can not be biased in a pure class B bias arrangement. Class B implies that the top active amplification device [10] is only on for one-half the cycle, even when the circuit is operating in the linear range. The other active amplification device is operating for the other half of the cycle (180 degrees out of phase) to complete the reproduction of the input signal at the output. For the present invention to work correctly, there must be a signal at the output of the first active amplification device for the full period of the input signal so that the second said amplification device can follow it via the feedback (summing) circuit. Hence, class A or class AB biasing must be used.

Given the above description, I claim:

1. A single input push/pull circuit eliminates the need for matched components due to the feedback (error) signal generated by the summing circuit, used in the output of an amplifier that cancels odd ordered harmonics in a signal having both odd and even harmonics and promotes even ordered harmonic generation when driven into the nonlinear region; said push/pull circuit comprising:
   a. an input terminal feeding said signal to a first active amplification device (tube or transistor);
   b. a second active amplification device (tube or transistor) driven by an error signal derived from the output of both the said first and said second active amplification devices;
   c. a summing (averaging) circuit adding the outputs of the two said active amplification devices and generates said error signal, based on the two said outputs, and feeds the error signal to the input of the said second active amplification device;
   d. a coupling device that delivers power from the outputs of the two said active amplification devices to a load.

* * * * *